United States Patent [19]

van de Pas et al.

[11] 4,442,967
[45] Apr. 17, 1984

[54] METHOD OF PROVIDING RAISED ELECTRICAL CONTACTS ON ELECTRONIC MICROCIRCUITS

[75] Inventors: Hermanus A. van de Pas; Huibert A. Knobbout, both of Nijmegen, Netherlands

[73] Assignee: U.S. Philips Corporation, New York, N.Y.

[21] Appl. No.: 353,724

[22] Filed: Mar. 1, 1982

[30] Foreign Application Priority Data

Mar. 20, 1981 [NL] Netherlands ............... 8101371

[51] Int. Cl.³ .......................................... H01L 21/441
[52] U.S. Cl. ................................. 228/159; 228/179
[58] Field of Search ................. 228/159, 179, 4.5

[56] References Cited

U.S. PATENT DOCUMENTS 3,357,090 12/1967 Tiffany ........................... 228/4.5
3,430,835 3/1969 Grable ............................ 228/4.5
4,219,143 8/1980 Gailland ......................... 228/159

FOREIGN PATENT DOCUMENTS 55-118643 9/1980 Japan ............................. 228/179
55-158642 12/1980 Japan ............................. 228/179
1056362 1/1967 United Kingdom ........... 228/179

Primary Examiner—Nicholas P. Godici
Assistant Examiner—Marc Hodak
Attorney, Agent, or Firm—Robert T. Mayer; Steven R. Biren

[57] ABSTRACT

A method of providing a raised contact portion on a contact area of an electronic microcircuit in which a ball is formed at one end of a metal wire by means of thermal energy, the ball is pressed against a contact area of the electronic microcircuit and is connected to said contact area. A weakening is created in the wire near the ball and the wire is then severed at the area of the weakening to provide the desired raised contact portion.

2 Claims, 6 Drawing Figures

METHOD OF PROVIDING RAISED ELECTRICAL CONTACTS ON ELECTRONIC MICROCIRCUITS

BACKGROUND OF THE INVENTION

The invention relates to a method of providing raised contact portions on contact areas of an electronic microcircuit.

Semiconductor circuit elements having raised contact portions, sometimes termed contact balls or bumps, are generally known. Other electronic microcircuits, for example magnetic bubble domain devices or liquid crystal devices, may also be provided with bumps. The bumps serve to make electric contact with conductors on a substrate or with conductors of a metal conductor grid in which no connection wires need be used. Providing the bumps in known manner is comparatively complicated and requires a number of process steps. Usually the bumps are provided in one or several layers by means of electroplating methods, photoetching methods being used to obtain a correct masking.

SUMMARY OF THE INVENTION

It is an object of the invention to provide a considerably simplified method of providing bumps in which the electroplating method may be omitted. In order to realize this object, the method according to the invention is characterized in that a ball is formed at one end of a metal wire by means of thermal energy, which ball is pressed against a contact area of the electronic microcircuit and is connected to said contact area, and in that the wire is severed near the ball at the area of a weakened portion provided in the wire.

The contact balls are thus obtained mechanically. Additional photoetching and electroplating methods are superfluous. Providing the bumps may be carried out in a substantially mechanized manner. Use may be made of the method known in semiconductor manufacture of providing wire bumps. As a result of the simplified manner of providing the bumps a considerable cost saving can be obtained.

In a favorable embodiment of the method according to the invention, the wire is passed through a capillary wire guide and the ball is connected to the contact area on the electronic microcircuit by means of the lower side of the capillary and the capillary is then moved relative to the wire by moving the capillary upwards and laterally over a small distance, after which the capillary is lowered again and a notch is provided in the wire by means of the lower side of the capillary.

The accurate provision of the weakened notched portion is very important in order to obtain a suitable shape of the raised contact portion. The lower side of the capillary can weaken the wire in a predetermined manner, so that the raised contact portions are reproduced in a substantially uniform manner. Modern control means in which, for example, microprocessors may be used, make it possible to determine the location of the weakened portion very accurately.

In a favorable embodiment of the invention the capillary is moved upwards approximately 2 to 3 times the wire thickness and is moved laterally 1.5 to 2 times the wire thickness.

In a further embodiment of the invention, a hard wire is used having a fine-granular crystal structure, the weakening in the wire being formed by recrystallization after the formation of the ball by means of thermal energy, the wire portion adjoining the ball obtaining a coarse-grannular crystal structure.

BRIEF DESCRIPTION OF THE DRAWING

The invention will now be described in greater detail with reference to the drawing, in which.

DESCRIPTION OF THE PREFERRED EMBODIMENTS

Figure 1:
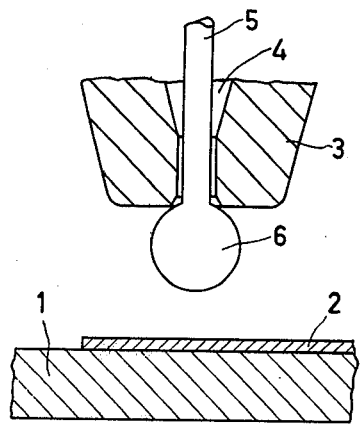
FIG. 1 shows the lower end of a capillary with a wire on which a ball is formed.

FIG. 1 shows a substrate 1 with a contact area 2 on which a raised contact portion or bump is to be provided. In the following description it is assumed that the substrate is a semiconductor element and that the contact area is a metallized zone which is connected to an active region in the semiconductor element. However, the invention may also be used in other electronic microcircuits, for example magnetic bubble domains or liquid crystals, or in carriers which are used in hybrid circuits in microelectronics. A substrate having raised contact portions may be connected to conductors of a carrier, the connection of all contact portions to the conductors being carried out simultaneously with no connection wires being necessary.

Referring now to FIG. 1, the lower end of a capillary 3 is shown over the semiconductor element 1. A wire 5 is passed through a bore 4 of the capillary. A ball 6 is formed at the end of the wire 5. This may be done in known manner, for example, by means of a gas flame or by means of an electrostatic discharge. The material of the wire is usually gold or aluminum, but other metals, for example, copper, may also be used. The capillary 3 may be, for example, a ceramic material. If desired, the capillary may be heated with known means.

Figure 2:
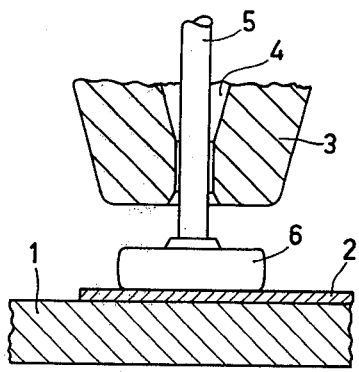
FIG. 2 shows the bump pressed on and attached to a substrate.

FIG. 2 shows the wire attached to the contact area 2 on the semiconductor element 1. The ball 6 has been pressed against the contact area 2 by means of the capillary 3, which is then retracted as shown in FIG. 2, and the ball is attached to the contact area by means of a thermocompression bond or ultrasonic vibration.

Figure 4:
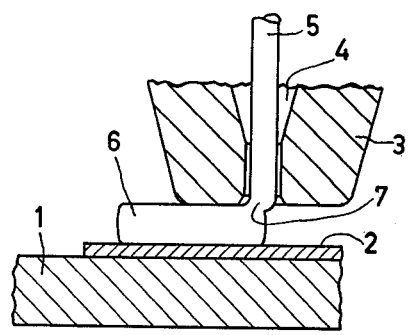
FIG. 4 shows the squeezing and weakening of the wire.
Figure 5:
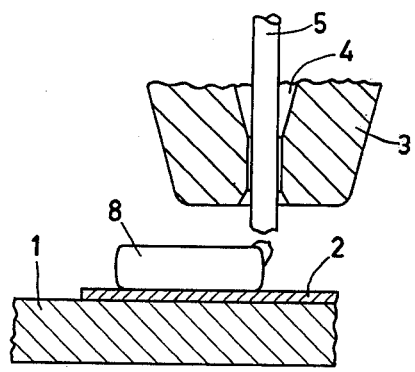
FIG. 5 shows the substrate provided with a bump after the wire has been severed.
Figure 3:
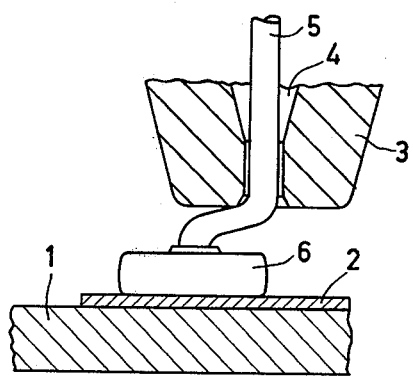
FIG. 3 shows the position in which the capillary is moved upwards and laterally.

After reaction, the capillary 3 is then moved laterally over a small distance. This position is shown in FIG. 3. The capillary is then lowered again (FIG. 4), a weakened portion in the form of a notch 7 being formed in the wire. As a result of this weakening, the wire can easily be severed. FIG. 5 shows the substrate 1 with a bump or contact portion 8 provided thereon after severing at the notch 7.

If desired, raised contact portions can be provided in further contact areas of the substrate 1. The substrate which has been mechanically provided with contact portions may now be connected in a known manner to conductors of a carrier.

It has provided very advantageous when the capillary, after connecting the raised portion to the substrate, makes an upward movement of approximately 2-3 times the wire thickness (see FIG. 2) and a lateral movement of 1.5-2 times the wire thickness (see FIG. 3). The weakening in the wire is then obtained in a favorable manner and in a desired location.

Figure 6:
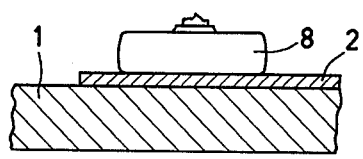
FIG. 6 shows a bump provided on a substrate in a different manner.

The weakening in the wire may also be obtained in a different manner. For example, a wire having a comparatively high hardness and a fine-granular crystal structure may be used. After providing the ball 6 at the end of the wire by means of thermal energy (FIG. 1) a coarse-crystalline structure will be formed in the wire portion immediately above the ball as a result of recrystallization, so that the wire is weakened there. After connecting the wire to the contact area 2, as shown in FIG. 2, a pulling force is exerted on the wire, and the wire will break at the area of the weakening. FIG. 6 shows the contact portion 8 thus provided. It may sometimes occur that a very short piece of wire is still present on the contact portion 8. This may not be objectionable, particularly when the substrate with the contact portion is connected to a carrier having metallized holes. The short wire pieces will then fall in the holes of the carrier.

It will be obvious that the weakening in the wire may also be provided in any other suitable manner.

What is claimed is:

1. A method of providing a raised contact portion on a contact area of an electronic microcircuit, which comprises:
    passing a metal wire through a capillary wire guide;
    forming a ball at one end of said metal wire by heating said wire;
    attaching said ball to said contact area by pressing said ball against said contact area with an end of said capillary wire guide;
    moving said capillary wire guide upwards and laterally with respect to said contact area;
    lowering said capillary wire guide to form a notch in said metal wire adjacent said ball with the end of said capillary wire guide; and
    severing said metal wire at the area of said notch.

2. A method as in claim 1, wherein the capillary wire guide is moved upwards a distance of about 2-3 times the thickness of said metal wire and is moved laterally a distance of about 1.5-2 times said wire thickness.

* * * * *